(12) United States Patent
Merchant et al.

(10) Patent No.: US 6,458,289 B1
(45) Date of Patent: Oct. 1, 2002

(54) CMP SLURRY FOR POLISHING SEMICONDUCTOR WAFERS AND RELATED METHODS

(75) Inventors: Sailesh Mansinh Merchant; Sudhanshu Misra; Pradip Kumar Roy, all of Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/413,742

(22) Filed: Oct. 6, 1999

(51) Int. Cl.$^7$ ............................................. C09K 13/00
(52) U.S. Cl. ..................... 252/79.1; 438/689; 438/691; 438/692
(58) Field of Search ..................... 252/79.1; 438/689, 438/691, 692

(56) References Cited

U.S. PATENT DOCUMENTS

| | | | |
|---|---|---|---|
| 5,366,542 A | 11/1994 | Yamada et al. ................. 106/3 |
| 5,516,346 A | 5/1996 | Cadien et al. ................. 51/308 |
| 5,662,769 A | 9/1997 | Schonauer et al. ......... 438/633 |
| 5,728,308 A | * 3/1998 | Muroyama et al. ........... 216/88 |
| 5,733,819 A | * 3/1998 | Kodama et al. ............. 438/692 |
| 5,916,819 A | 6/1999 | Skrovan et al. ............. 438/692 |
| 5,916,855 A | * 6/1999 | Avanzino et al. ............. 51/307 |
| 6,027,669 A | * 2/2000 | Miura et al. ............. 252/518.1 |
| 6,099,394 A | 8/2000 | James et al. ................... 451/72 |
| 6,117,783 A | * 9/2000 | Small et al. ................. 438/693 |
| 6,136,714 A | 10/2000 | Schultz ....................... 438/692 |
| 6,140,130 A | 10/2000 | Salmen et al. ................ 436/55 |

\* cited by examiner

*Primary Examiner*—Benjamin L. Utech
*Assistant Examiner*—Vanessa Perez Ramos
(74) *Attorney, Agent, or Firm*—Allen, Dyer, Doppelt, Milbrath & Gilchrist, P.A.

(57) ABSTRACT

A CMP slurry includes a first emulsion having a continuous aqueous phase and a second emulsion. The first emulsion includes abrasive particles, and the second emulsion captures metal particles polished from the semiconductor wafer. Thus, metal particles can be removed from the slurry during CMP to avoid damaging and/or contaminating the semiconductor wafer.

18 Claims, 4 Drawing Sheets

CMP SLURRY FOR POLISHING SEMICONDUCTOR WAFERS AND RELATED METHODS

FIELD OF THE INVENTION

The present invention relates to semiconductor processing, and, more particularly, to planarizing or polishing semiconductor wafer surfaces during the manufacture of integrated circuits.

BACKGROUND OF THE INVENTION

Semiconductor devices, also called integrated circuits, are mass produced by fabricating of identical circuit patterns on a single semiconductor wafer. During the process, the wafer is cut into identical dies or chips. Although commonly referred to as semiconductor devices, the devices are fabricated from various materials, including conductors (e.g. copper, aluminum and tungsten), non-conductors (e.g. silicon dioxide) and semiconductors (e.g. silicon). Silicon is the most commonly used semiconductor, and is used in either its single crystal or polycrystalline form. Polycrystalline silicon is often referred to as polysilicon or "poly". The conductivity of the silicon is adjusted by adding impurities in a process commonly referred to as doping.

Within an integrated circuit, thousands of devices (e.g., transistors, diodes) are formed. Typically, contacts are formed where a device interfaces to an area of doped silicon. Specifically, plugs are typically formed to connect metal layers with device active regions. Vias are typically formed to connect metal layers with other metal layers. Also interconnects are typically formed to serve as wiring lines to interconnect the many devices on the integrated circuit and the many regions within an individual device. These contacts and interconnects are formed using conductive materials.

The integrated circuit devices with their various conductive layers, semiconductive layers, insulating layers, contacts and interconnects are formed by fabrication processes, including doping processes, deposition processes, photolithographic processes, etching processes and other processes. At certain steps, it is often desirable to achieve a pre-determined level of surface planarity, uniformity, and/or roughness. It is also desirable to minimize surface defects such as pits and scratches. Such surface irregularities may affect the performance of the final semiconductor device and/or create problems during subsequent processing steps.

One common technique to planarize a wafer is known as chemical mechanical polishing (CMP). CMP is very widely used technique which delivers a slurry of material to the wafer surface and while a polishing pad or belt is passed over the wafer surface. The slurry typically includes a plurality of abrasive particles dispersed in a liquid. For example, U.S. Pat. No. 5,728,308 entitled "Method of polishing a semiconductor substrate during production of a semiconductor device" discloses a conventional slurry used for chemical mechanical polishing including particulates comprised of metal oxides such as silica ($SiO_2$), alumina ($Al_2O_3$), titanium oxide ($TiO_2$), and cerium oxide ($CeO_2$) of a particle size of about 10 nm in an aqueous solution of potassium hydroxide (KOH).

A problem with current CMP slurries is that polished metal in the slurry can cause scratches on the wafer surface or contaminate layers on the wafer. Therefore, the slurry is not re-usable and increases waste.

SUMMARY OF THE INVENTION

In view of the foregoing background, it is therefore an object of the present invention to remove metal particles from a slurry during CMP to avoid damaging and/or contaminating the semiconductor wafer.

It is another object of the present invention to provide a slurry which can be processed and re-used during CMP.

These and other objects, features and advantages in accordance with the present invention are provided by a CMP slurry comprising a first emulsion including a continuous aqueous phase and a second emulsion. The first emulsion includes abrasive particles, and the second emulsion captures metal particles polished from the semiconductor wafer. Thus, metal particles can be removed from the slurry during CMP to avoid damaging and/or contaminating the semiconductor wafer. Preferably, the second emulsion comprises an organic phase and a dispersed aqueous phase, and the dispersed aqueous phase preferably comprises a dispersed aqueous acidic phase. The organic phase may comprise at least one of an alcohol and an iso-alcohol and preferably includes at least one complexing agent, such as ethylene diamine tetra-acetate (edta), di-ethylene triamine penta-acidic acid (dtpa), 8-hydroxy quinoline, bi-pyridine, or ortho-phenanthroline, for example, for reacting with metal particles polished from the semiconductor wafer to form organometallic complexes.

The organic phase preferably transports the organometallic complexes to an interface between the organic phase and the dispersed aqueous phase by diffusion. The organometallic complexes may decompose at the interface to release the complexing agent into the organic phase and release the metal particles into the dispersed aqueous phase.

The objects, features and advantages in accordance with the present invention are also provided by a method of making a CMP slurry including the steps of: forming a second emulsion to capture metal particles polished from the semiconductor wafer, emulsifying the second emulsion in a continuous aqueous phase to define a first emulsion, and adding abrasive particles to the continuous aqueous phase. Preferably, the step of forming the second emulsion comprises emulsifying a dispersed aqueous phase in an organic phase. Thus, metal particles can be removed from the slurry during CMP to avoid damaging and/or contaminating the semiconductor wafer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
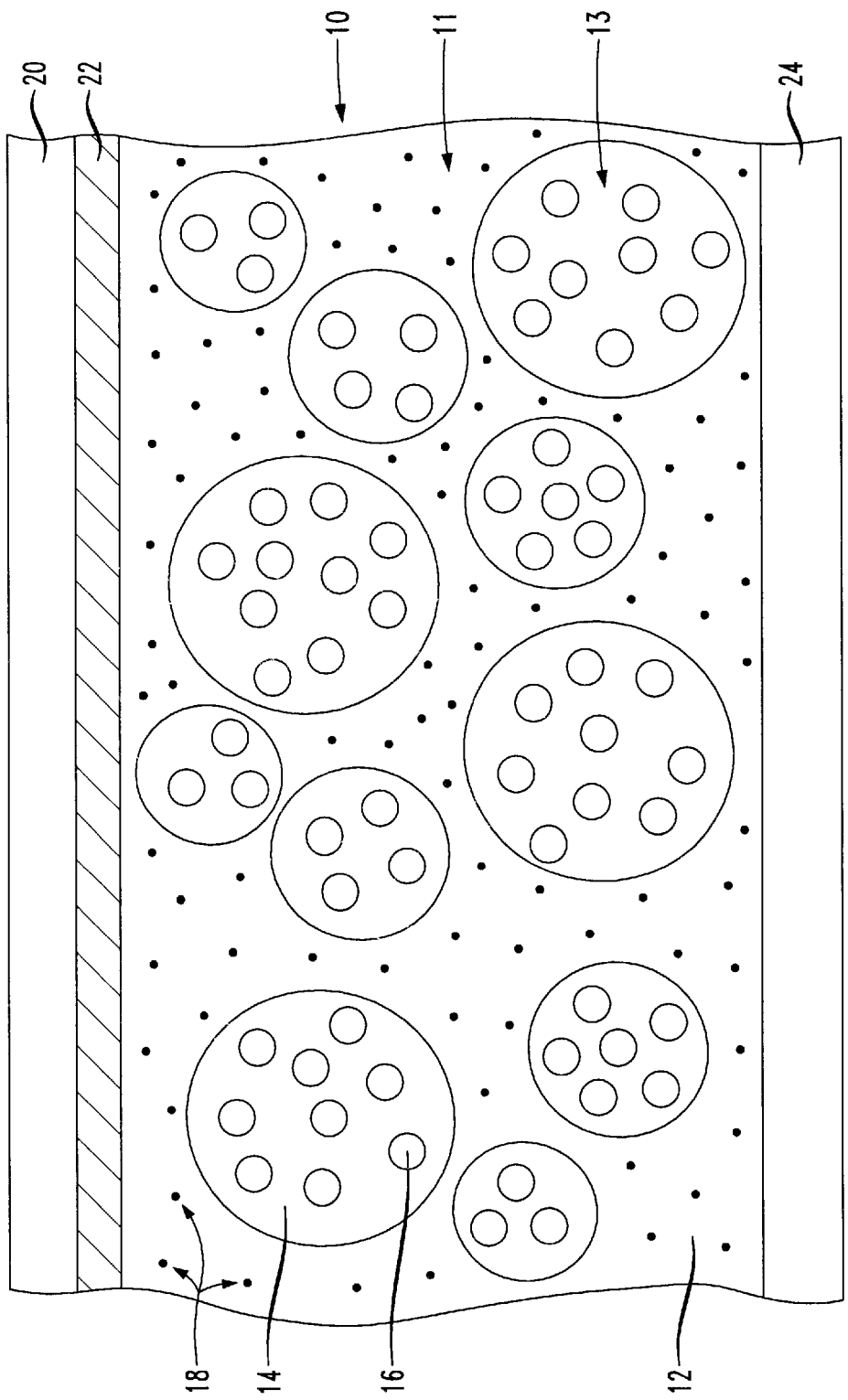
FIG. 1 is a schematic view of a CMP slurry at the interface of a semiconductor wafer and a polishing article in accordance with the present invention.

Referring initially to FIG. 1, a CMP slurry 10 in accordance with the present invention will now be described. The CMP slurry 10 includes a first emulsion 11 having a continuous aqueous phase ($AQ_E$) 12 and a second emulsion 13. An emulsion is a system including a liquid dispersed with or without an emulsifier in an immiscible liquid usually in droplets of larger than colloidal size. The first emulsion 11 includes abrasive particles 18 such as silica, alumina or ceria as would be appreciated by those skilled in the art. The second emulsion 13 preferably comprises an organic phase (ORG) 14 and a dispersed aqueous phase ($AQ_I$) 16 for capturing metal particles polished from the semiconductor wafer 20.

The semiconductor wafer 20 includes a metal layer 22 which may include copper, tantalum, titanium, tantalum nitride or any other metal commonly used in the production of integrated circuits. Metal particles are polished off the metal layer 22 during a CMP process using the slurry 10 at an interface between the semiconductor wafer 20 and a polishing article 24, such as a pad or belt. Such metal particles can damage and/or contaminate the semiconductor wafer as discussed above. The slurry 10 captures the metal particles in the second emulsion 13, which permits the removal of the metal particles and allows the slurry 10 to be continuously recirculated during the CMP process without damaging and/or contaminating the layers of the semiconductor wafer 20.

Figure 2:
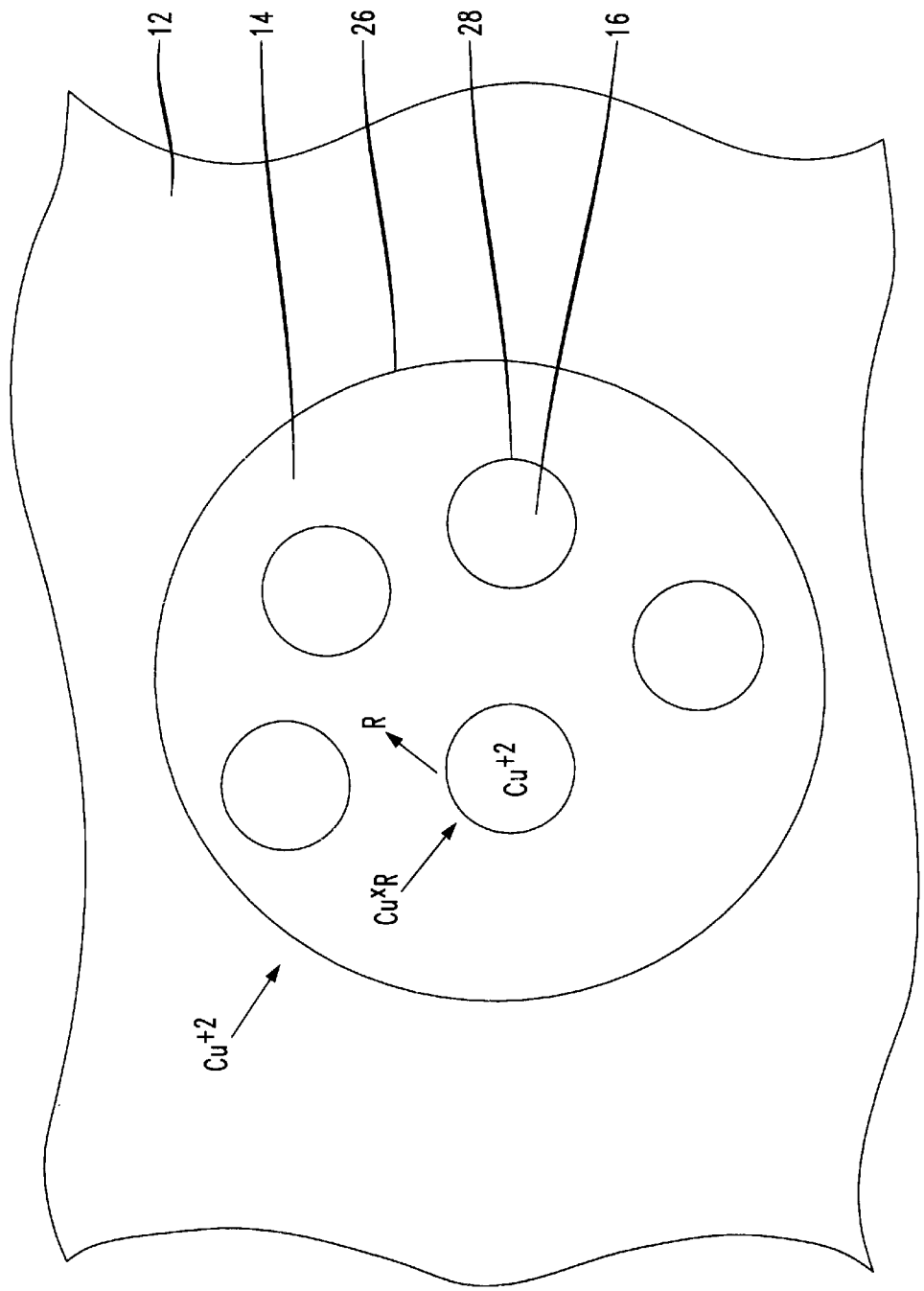
FIG. 2 is an enlarged schematic view of the CMP slurry to schematically illustrate movement of metal across the first and second emulsions in accordance with the present invention.

Referring additionally to FIG. 2, movement of the metal across the first and second emulsions 12, 14 will now be described in accordance with the present invention. The dispersed aqueous phase 16 is preferably a dispersed aqueous acidic phase. The organic phase 14 may comprise at least one of an alcohol and an iso-alcohol, for example, and preferably includes at least one complexing agent, such as ethylene diamine tetra-acetate (edta), di-ethylene triamine penta-acidic acid (dtpa), 8-hydroxy quinoline, bi-pyridine, or ortho-phenanthroline, including ligand R, for example, for reacting with metal particles polished from the metal layer 22 of semiconductor wafer 20 to form organometallic complexes. For example, di-ethylene triamine penta-acidic acid is particularly suitable for copper, tungsten or tantalum, 8-hydroxy quinoline is particularly suitable for aluminum, and bi-pyridine is particularly suitable for copper. As illustrated, the metal particles polished from the metal layer 22 may form, for example, copper ions $Cu^{+2}$ in the slurry 10. The copper ions $Cu^{+2}$ will readily form organometallic complexes $Cu^xR$ by chemical reaction with the complexing agent at the interface 26 between the continuous aqueous phase 12 and the organic phase 14.

The organic phase 14 then transports the organometallic complexes $Cu^xR$ to an interface 28 between the organic phase 14 and the dispersed aqueous phase 16 by diffusion. At this interface 28, the organometallic complexes $Cu^xR$ then decompose by chemical reaction to release the ligand R back into the organic phase 14 and release the copper ions $Cu^{+2}$ into the dispersed aqueous phase 16. The released ligand R of the complexing agent is then available for complexing reaction with the metal species, e.g. copper ions $Cu^{+2}$, at the interface 28 between the organic phase 14 and the dispersed aqueous phase 16. This chemical reaction at the interface 28 between the organic phase 14 and the dispersed aqueous phase 16 results in a continuous chemical potential gradient across the organic phase that enhances the transport of the organometallic complexes $Cu^xR$.

As mentioned above, the dispersed aqueous phase 16 may be an aqueous acidic dispersed phase, and the pH differences between the continuous aqueous phase 12 and the dispersed aqueous phase 16 can effect the chemical potential gradient for metal transport across the organic phase 14. By having a continuous driving force across the organic phase 14, the interface 26 will not be flooded with an influx of metal ions. The metal transport across the organic phase 14 will be diffusion limited, but will not be limited by the chemical complex formation and decomposition reactions at the interfaces 26, 28.

Figure 3:
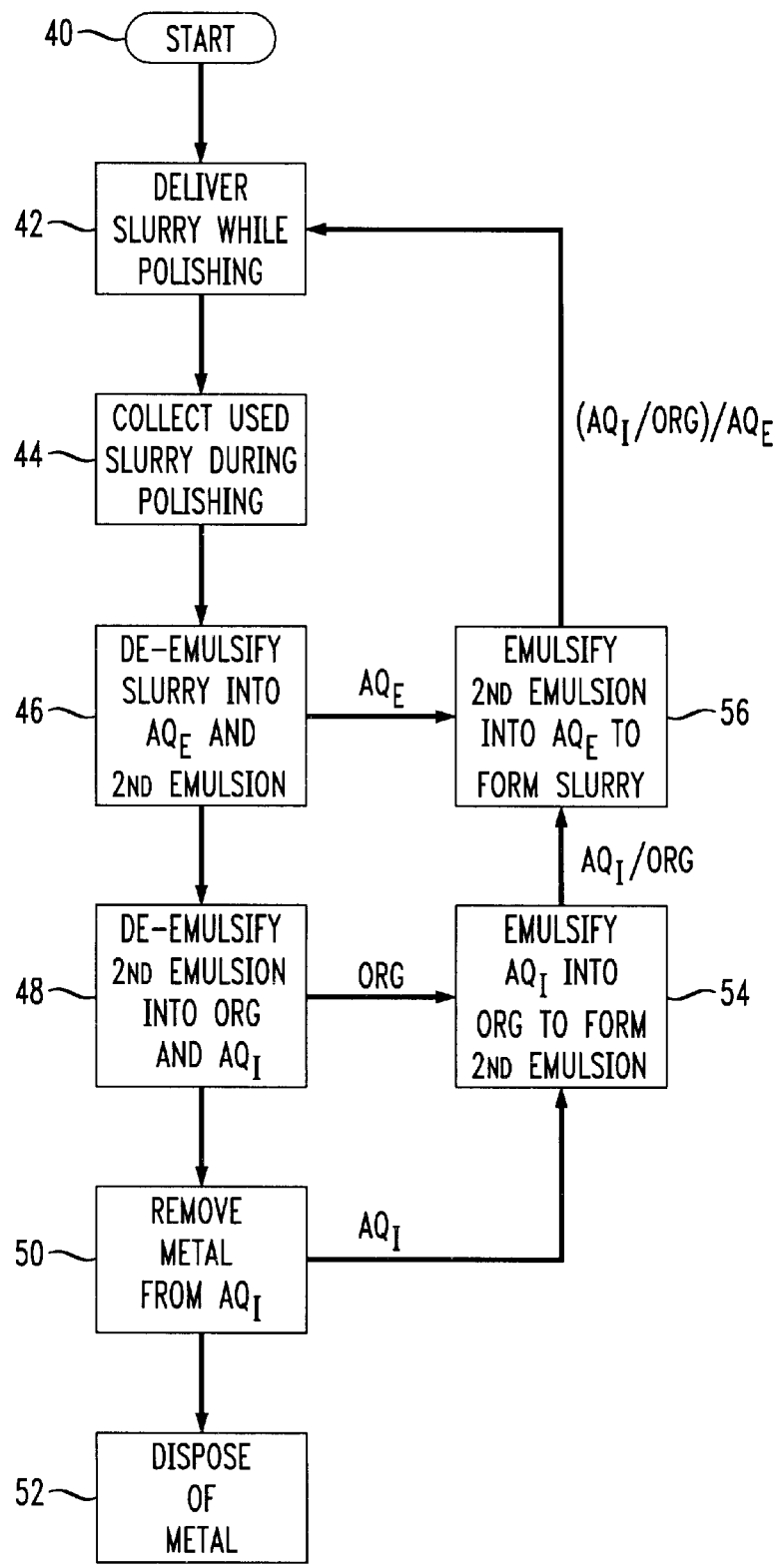
FIG. 3 is a flowchart illustrating the basic steps of chemically mechanically polishing using a slurry in accordance with the present invention.
Figure 4:
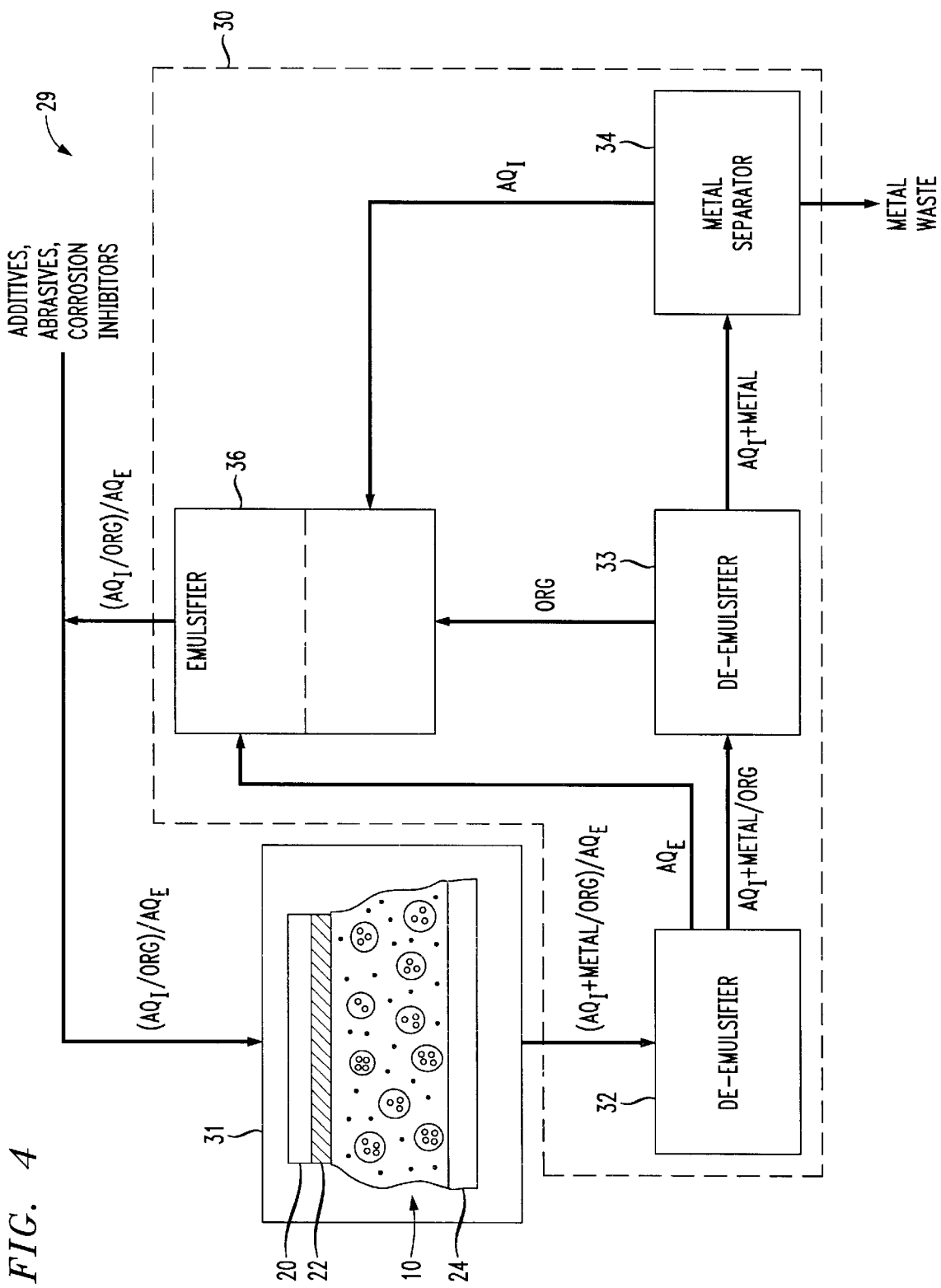
FIG. 4 is a schematic diagram of a CMP system for processing used slurry in accordance with the present invention.

Referring now to FIGS. 3 and 4, a system 29 and a method for CMP, in accordance with the present invention, will now be described. Specifically, while referring to FIG. 3, the system 29 includes a slurry processor 30 and a polishing device 31. The polishing device 31 includes the polishing article 24, such as a pad or belt. The polishing device 31 provides relative movement between the semiconductor wafer 20 and the polishing article 24 with a slurry 10 therebetween. The wafer 20, the polishing article 24 or both may be rotated during CMP. The slurry processor 30 includes a first de-emulsifier 32 which receives the used slurry, a second de-emulsifier 33 downstream from the first de-emulsifier, a metal separator 34 downstram from the second de-emulsifier, and an emulsifier 36 connected to both de-emulsifiers and the metal separator.

Referring to FIGS. 3 and 4, the method for CMP begins at Block 40 and a slurry 10 is delivered to the interface between the semiconductor wafer 20 and the polishing article 24 in the polishing device 31. Here, the slurry 10 is preferably a multiple emulsion (($AQ_I$/ORG) /$AQ_E$) as described above with reference to FIGS. 1 and 2. A second emulsion ($AQ_I$/ORG) 13 is emulsified in a continuous aqueous phase ($AQ_E$) 12 to define a first emulsion 11. A dispersed aqueous phase ($AQ_I$) 16 is emulsified in an organic phase ORG 14 to define the second emulsion 13. Again, as described in detail above, the dispersed aqueous phase ($AQ_I$) 16 captures metal particles, e.g. metal ions, polished from the semiconductor wafer 20. Of course additives, abrasives, corrosion inhibitors etc., may be added to the continuous aqueous phase 12 of the slurry 10 as would be appreciated by the skilled artisan.

At Block 44, the used slurry 10 containing the metal particles is collected and delivered to the first de-emulsifier 32 where it is de-emulsified (Block 46) into the continuous aqueous phase 12 and the second emulsion 13. The second emulsion 13 including the metal particles is delivered to the second de-emulsifier 33 where it is de-emulsified (Block 48) into the organic phase 14 and the dispersed aqueous phase 16. The dispersed aqueous phase 16 containing the metal particles is delivered to the metal separator 34 where the metal particles are removed (Block 50) from the dispersed aqueous phase 16 and subsequently disposed at Block 52.

The emulsifier 36 receives the organic phase from the second de-emulsifier 33 and receives the dispersed aqueous phase 16, without the metal particles, from the metal separator 34. The dispersed aqueous phase 16 is emulsified in the organic phase to re-form the second emulsion 13 in a first stage of emulsification (Block 54). The emulsifier 36 also receives the continuous aqueous phase 12 from the first de-emulsifier 32. The second emulsion 13 is then emulsified (Block 56) in the continuous aqueous phase 12 to re-form the first emulsion 11 and complete the slurry 10. The slurry 10, as a multiple emulsion (($AQ_I$/ORG)/$AQ_E$), is then recirculated into the loop and delivered to the polishing device 31. Thus, as described, the slurry 10 can be continuously recirculated during a CMP process without damaging and/or contaminating the layers, e.g. metal layer 22, of the semiconductor wafer 20.

With respect to the emulsifier 36 and the first and second de-emulsifiers 32, 33, it is noted that emulsions may be prepared readily by shaking together the two liquids or by adding one phase drop by drop to the other phase with some form of agitation. Such agitation may include, for example, irradiation by high intensity ultrasonic waves. In a typical emulsifying device, the two liquids are forced through a narrow slit between a rapidly rotating rotor and a stator. The preparation of stable emulsions must be controlled carefully, because emulsions are sensitive to variations in the mode of agitation, the nature and amount of an emulsifying agent, and temperature changes. Emulsions may be de-emulsified in a number of ways including: addition of multivalent ions of a charge opposite to the emulsion droplet; chemical action; freezing; heating; aging; centrifuging; application of high-potential alternating electric fields; and treatment with low intensity ultrasonic waves.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A chemical mechanical polishing (CMP) slurry for polishing a semiconductor wafer including metal, the slurry comprising:
a first emulsion comprising a continuous aqueous phase and a second emulsion, wherein the first emulsion includes abrasive particles, and wherein the second emulsion captures metal particles polished from the semiconductor wafer.

2. A CMP slurry according to claim 1, wherein the second emulsion comprises an organic phase and a dispersed aqueous phase.

3. A CMP slurry according to claim 2, wherein the dispersed aqueous phase comprises a dispersed aqueous acidic phase.

4. A CMP slurry according to claim 2, wherein the organic phase comprises at least one of an alcohol and an iso-alcohol.

5. A CMP slurry according to claim 2, wherein the organic phase includes at least one complexing agent for reacting with metal particles polished from the semiconductor wafer to form organometallic complexes.

6. A CMP slurry according to claim 5, wherein the at least one complexing agent comprises at least one of ethylene diamine tetra-acetate (edta), di-ethylene triamine penta-acidic acid (dtpa), 8-hydroxy quinoline, bi-pyridine, and ortho-phenanthroline.

7. A CMP slurry according to claim 5, wherein the organic phase transports the organometallic complexes to an interface between the organic phase and the dispersed aqueous phase by diffusion.

8. A CMP slurry according to claim 7, wherein the organometallic complexes decompose at the interface to release the complexing agent into the organic phase and release the metal particles into the dispersed aqueous phase.

9. A CMP slurry according to claim 1, wherein the abrasive particles comprise at least one of silica, ceria and alumina.

10. A chemical mechanical polishing (CMP) slurry for polishing a semiconductor wafer including metal, the slurry comprising:
a first emulsion comprising a continuous aqueous phase including abrasive particles, and a second emulsion;
the second emulsion comprising an organic phase including at least one complexing agent for the metal, and a dispersed aqueous phase.

11. A CMP slurry according to claim 10, wherein the second emulsion captures metal particles polished from the semiconductor wafer.

12. A CMP slurry according to claim 10, wherein the dispersed aqueous phase comprises a dispersed aqueous acidic phase.

13. A CMP slurry according to claim 10, wherein the organic phase comprises at least one of an alcohol and an iso-alcohol.

14. A CMP slurry according to claim 10, wherein the at least one complexing agent reacts with metal particles polished from the semiconductor wafer to form organometallic complexes.

15. A CMP slurry according to claim 14, wherein the organic phase transports the organometallic complexes to an interface between the organic phase and the dispersed aqueous phase by diffusion.

16. A CMP slurry according to claim 15, wherein the organometallic complexes decompose at the interface to release the complexing agent into the organic phase and release the metal particles into the dispersed aqueous phase.

17. A CMP slurry according to claim 10, wherein the at least one complexing agent comprises at least one of ethylene diamine tetra-acetate (edta), di-ethylene triamine penta-acidic acid (dtpa), 8-hydroxy quinoline, bi-pyridine, and ortho-phenanthroline.

18. A CMP slurry according to claim 10, wherein the abrasive particles comprise at least one of silica, ceria and alumina.

* * * * *